(12) United States Patent
Segawa

(10) Patent No.: US 8,575,611 B2
(45) Date of Patent: Nov. 5, 2013

(54) LIGHT-EMITTING DISPLAY DEVICE AND MANUFACTURING METHOD FOR LIGHT-EMITTING DISPLAY DEVICE

(75) Inventor: Yasuo Segawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/370,842

(22) Filed: Feb. 10, 2012

(65) Prior Publication Data

US 2012/0138942 A1 Jun. 7, 2012

Related U.S. Application Data

(63) Continuation of application No. PCT/JP2011/003429, filed on Jun. 16, 2011.

(30) Foreign Application Priority Data

Jun. 22, 2010 (JP) ................................ 2010-142105

(51) Int. Cl.
*H01L 29/04* (2006.01)

(52) U.S. Cl.
USPC .............. 257/59; 257/E27.121; 257/E33.053; 438/23

(58) Field of Classification Search
USPC ................ 257/59, E27.121, E33.053; 438/23
See application file for complete search history.

(56) References Cited

U.S. PATENT DOCUMENTS

| | | | |
|---|---|---|---|
| 6,424,326 B2 * | 7/2002 | Yamazaki et al. | 345/77 |
| 6,512,504 B1 | 1/2003 | Yamauchi | |
| 6,566,174 B1 * | 5/2003 | Takechi et al. | 438/149 |
| 6,628,363 B1 * | 9/2003 | Sano et al. | 349/151 |
| 6,828,951 B2 * | 12/2004 | Yamazaki et al. | 345/77 |
| 6,872,973 B1 * | 3/2005 | Koyama et al. | 257/59 |
| 6,879,309 B2 | 4/2005 | Yamauchi | |
| 6,927,418 B2 * | 8/2005 | Hotta | 257/57 |
| 7,015,081 B2 * | 3/2006 | Hotta | 438/151 |
| 7,045,398 B2 * | 5/2006 | Yasukawa | 438/149 |
| 7,053,890 B2 * | 5/2006 | Inukai | 345/211 |
| 7,173,279 B2 * | 2/2007 | Yamazaki et al. | 257/59 |
| 7,227,187 B2 * | 6/2007 | Hotta | 257/64 |
| 7,274,349 B2 | 9/2007 | Yamauchi | |

(Continued)

FOREIGN PATENT DOCUMENTS

| JP | 2001-051622 | 2/2001 |
|---|---|---|
| JP | 2003-174170 | 6/2003 |

(Continued)

OTHER PUBLICATIONS

Japan Office action, mail date is Aug. 6, 2013.

*Primary Examiner* — Kimberly Rizkallah
*Assistant Examiner* — Caleb Henry
(74) *Attorney, Agent, or Firm* — Greenblum & Bernstein, P.L.C.

(57) ABSTRACT

In the light-emitting display device according to the present invention, a side-contact structure is adopted in order to secure a TFT characteristic in a linear region (on-current). In a TFT configuring a switching transistor, a thickness of a semiconductor layer (channel layer) in a region corresponding to the source/drain electrodes is increased. In contrast, in a TFT configuring a driving transistor, in order to maintain an on current, a thickness of a semiconductor layer (channel layer) in a region corresponding to the source/drain electrodes is reduced. This configuration is manufactured using a half-tone mask. With this, it is possible to suppress the off-current in the switching transistor, while securing the on-current in the driving transistor.

11 Claims, 14 Drawing Sheets

(56) References Cited

U.S. PATENT DOCUMENTS

| | | | |
|---|---|---|---|
| 7,344,930 B2 * | 3/2008 | Hotta | 438/154 |
| 7,397,064 B2 * | 7/2008 | Yamazaki et al. | 257/59 |
| 7,403,179 B2 * | 7/2008 | Koyama et al. | 345/76 |
| 7,416,928 B2 * | 8/2008 | Kakehata et al. | 438/166 |
| 7,557,498 B2 * | 7/2009 | Chan et al. | 313/498 |
| 7,629,610 B2 * | 12/2009 | Yamazaki et al. | 257/59 |
| 7,642,559 B2 | 1/2010 | Yamazaki | |
| 7,701,134 B2 | 4/2010 | Yamazaki | |
| 7,741,775 B2 | 6/2010 | Yamazaki | |
| 7,825,406 B2 | 11/2010 | Yoshida | |
| 7,843,407 B2 | 11/2010 | Yamauchi | |
| 7,947,981 B2 | 5/2011 | Yamazaki | |
| 7,994,496 B2 * | 8/2011 | Saito et al. | 257/40 |
| 7,994,505 B2 | 8/2011 | Saitou | |
| 8,194,006 B2 * | 6/2012 | Koyama et al. | 345/76 |
| 8,247,817 B2 * | 8/2012 | Kaitoh et al. | 257/59 |
| 8,354,978 B2 * | 1/2013 | Ozawa et al. | 345/76 |
| 8,415,198 B2 * | 4/2013 | Itagaki et al. | 438/104 |
| 2001/0028060 A1 * | 10/2001 | Yamazaki et al. | 257/72 |
| 2002/0000576 A1 * | 1/2002 | Inukai | 257/202 |
| 2002/0180672 A1 * | 12/2002 | Yamazaki et al. | 345/77 |
| 2003/0132900 A1 | 7/2003 | Yamauchi | |
| 2004/0016924 A1 * | 1/2004 | Yamada et al. | 257/59 |
| 2004/0065902 A1 | 4/2004 | Yamazaki | |
| 2004/0188683 A1 * | 9/2004 | Hotta | 257/59 |
| 2005/0056841 A1 * | 3/2005 | Yamazaki et al. | 257/59 |
| 2005/0161672 A1 | 7/2005 | Yamazaki | |
| 2005/0162356 A1 * | 7/2005 | Koyama et al. | 345/76 |
| 2005/0184936 A1 | 8/2005 | Yamauchi | |
| 2005/0212047 A1 * | 9/2005 | Hotta | 257/347 |
| 2005/0230685 A1 * | 10/2005 | Oishi et al. | 257/72 |
| 2006/0051914 A1 * | 3/2006 | Kakehata et al. | 438/197 |
| 2006/0097256 A1 | 5/2006 | Yamazaki | |
| 2006/0192205 A1 | 8/2006 | Yamazaki | |
| 2007/0034874 A1 * | 2/2007 | Arao et al. | 257/59 |
| 2007/0146566 A1 * | 6/2007 | Hosoya | 349/43 |
| 2007/0188089 A1 | 8/2007 | Choi | |
| 2007/0205415 A1 * | 9/2007 | Hotta | 257/72 |
| 2007/0284586 A1 * | 12/2007 | Park et al. | 257/72 |
| 2008/0018566 A1 | 1/2008 | Yamauchi | |
| 2008/0179597 A1 | 7/2008 | Yamazaki | |
| 2009/0015524 A1 * | 1/2009 | Koyama et al. | 345/77 |
| 2009/0020759 A1 * | 1/2009 | Yamazaki | 257/59 |
| 2009/0321725 A1 | 12/2009 | Yoshida | |
| 2010/0032673 A1 * | 2/2010 | Saitou et al. | 257/59 |
| 2010/0051937 A1 * | 3/2010 | Kaji et al. | 257/43 |
| 2010/0248405 A1 * | 9/2010 | Tanaka | 438/34 |
| 2011/0090209 A1 | 4/2011 | Yamauchi | |

FOREIGN PATENT DOCUMENTS

| | | |
|---|---|---|
| JP | 2007-219517 | 8/2007 |
| JP | 2008-205330 | 9/2008 |
| JP | 2008-211192 | 9/2008 |
| JP | 2009-080491 | 4/2009 |
| JP | 2009-212219 | 9/2009 |
| JP | 2009-540623 | 11/2009 |
| JP | 2010-040848 | 2/2010 |
| WO | 2008/145999 | 12/2008 |

\* cited by examiner

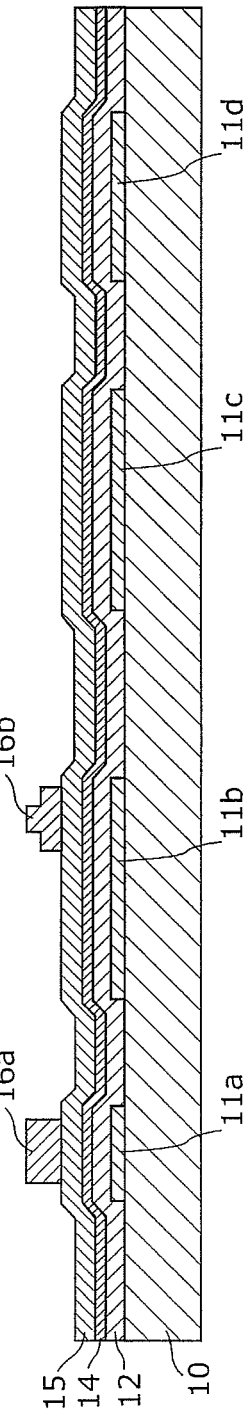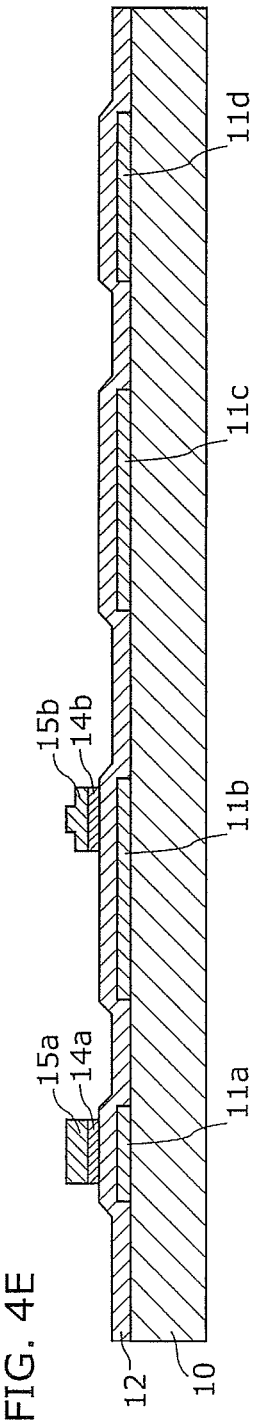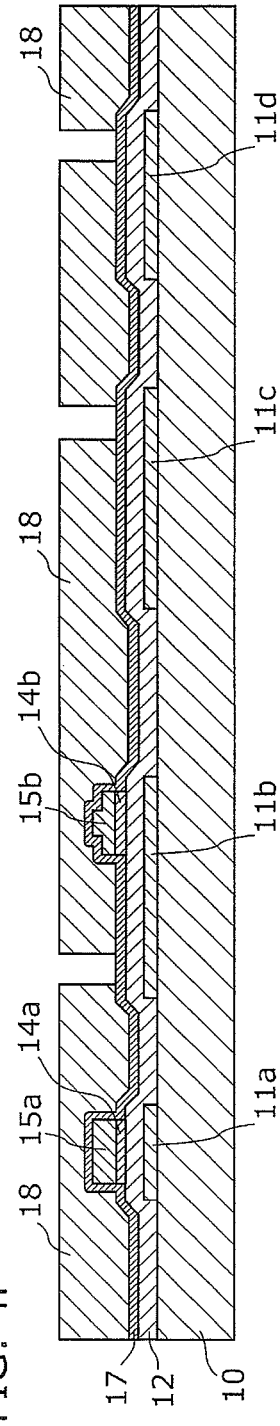

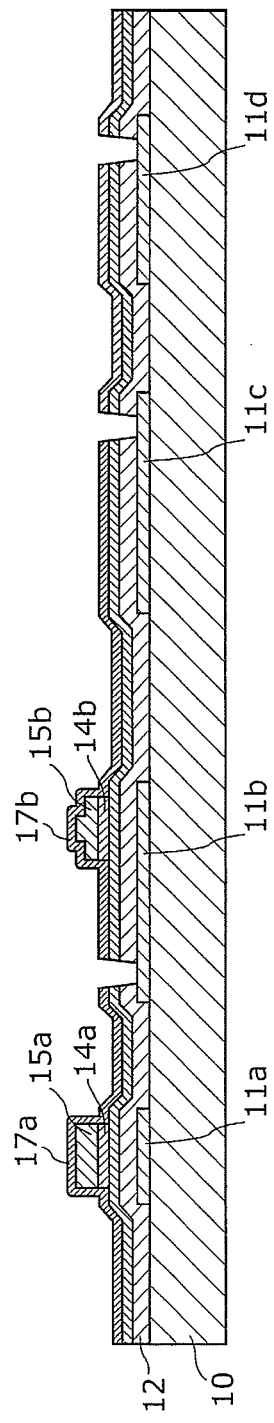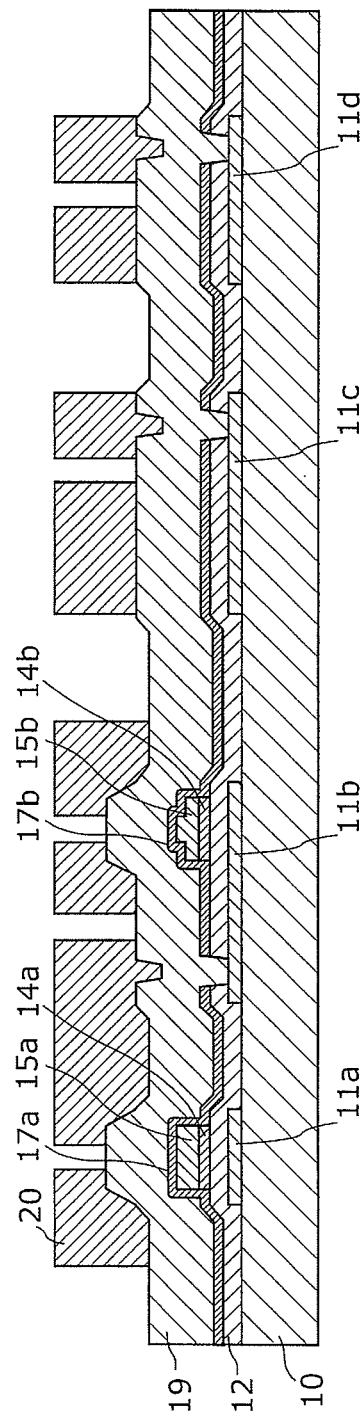

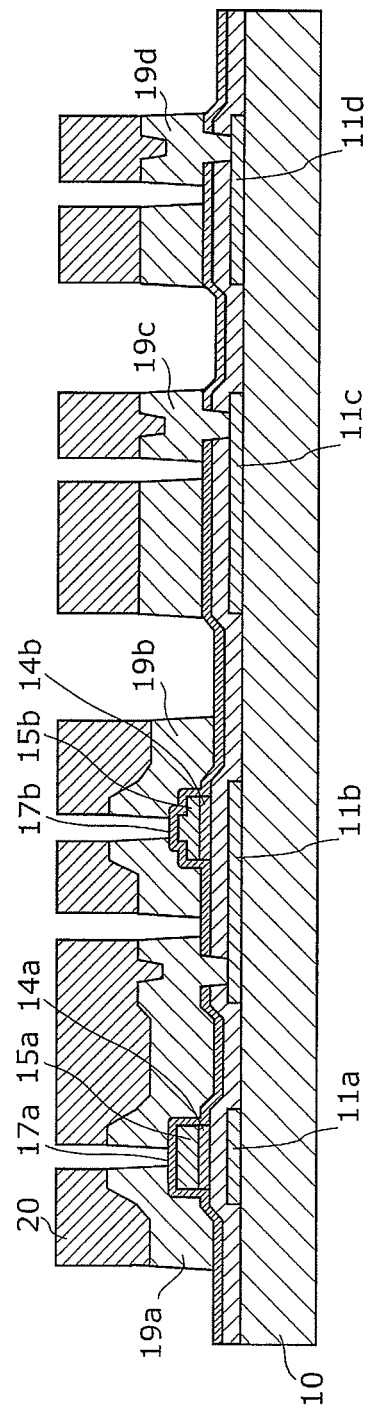
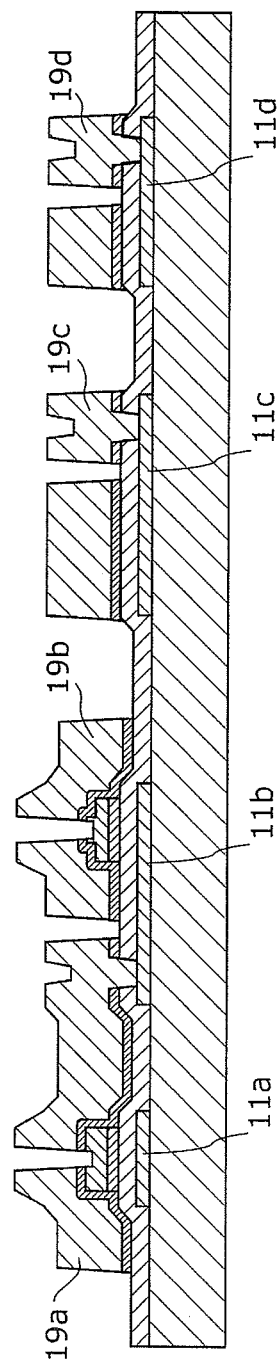

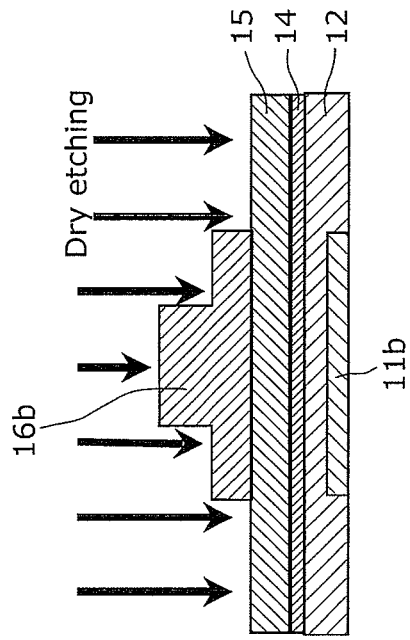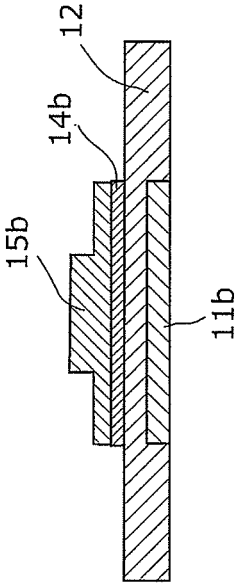
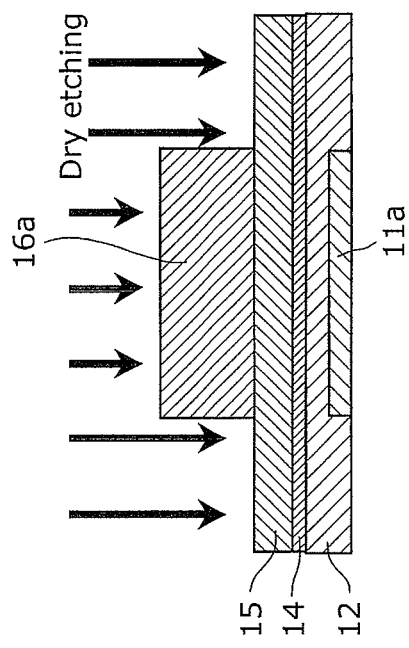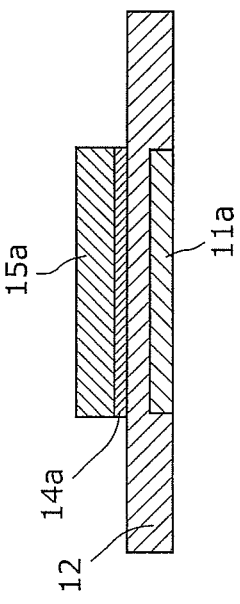

LIGHT-EMITTING DISPLAY DEVICE AND MANUFACTURING METHOD FOR
LIGHT-EMITTING DISPLAY DEVICE

CROSS REFERENCE TO RELATED APPLICATIONS

This is a continuation application of PCT Patent Application No. PCT/JP2011/003429 filed on Jun. 16, 2011, designating the United States of America, which is based on and claims priority of Japanese Patent Application No. 2010-142105 filed on Jun. 22, 2010. The entire disclosures of the above-identified applications, including the specifications, drawings and claims are incorporated herein by reference in their entirety.

BACKGROUND OF THE INVENTION (1) Field of the Invention

The present invention relates to light-emitting display devices which display images and manufacturing methods for the light-emitting display devices, and particularly to a light-emitting display device including thin film transistors for driving an organic EL display and organic EL elements and a manufacturing method for the light-emitting display device.

(2) Description of the Related Art

In recent years, organic EL display devices using electro luminescence (EL) of organic material has been attracting attention as one of the next-generation flat panel displays replacing the liquid crystal displays. Unlike the voltage-driven liquid crystal displays, the organic EL display devices are current-driven devices, and are divided into the active-matrix type and the passive-matrix type.

For example, in an active-matrix organic EL display device, an image is displayed by current flowing in an organic EL element provided in each pixel, causing the organic EL element to emit light. The amount of current flowing in the organic EL element is controlled by a thin film transistor (TFT).

As a channel layer of such a TFT, an amorphous silicon film has been used, for example. However, there has been research and development for forming (micro) crystals in the amorphous silicon film to form a crystalline silicon film so as to increase the driving capacity of TFT.

In a pixel circuit in the organic EL display device, the TFTs are used as a driving transistor for supplying driving current to the organic EL element, and a switching transistor for supplying data signals according to the intensity of the driving current to a gate electrode of a current driving transistor. A significantly low off-current is required for the switching transistor, and a current (mobility) for driving the organic EL element, that is, on-current is required for the driving transistor. However, forming micro crystals in the channel layer portion of the TFT so as to increase the driving current (mobility) of the TFT increases the off-current of the TFT.

In response to this problem, a technology in which the TFT composing the switching transistor uses amorphous semiconductor for the channel layer, and the TFT composing the driving transistor uses a crystalline silicon film for the channel layer has been disclosed (for example, see Patent Literature 1: Japanese Unexamined Patent Application Publication No. 2007-219517).

SUMMARY OF THE INVENTION

However, when the amorphous silicon film is used for the channel layer of the TFT, the off-current is low due to a large bandgap in the amorphous silicon film and the on-current is also low due to low mobility. In contrast, when the crystalline silicon film is used for the channel layer of the TFT, the on-current is large due to high mobility, and off-current is also high due to the presence of grain boundary and defect in the crystalline silicon film.

Accordingly, a TFT in which the channel layer has a two-layer structure including a channel layer made of a crystalline silicon film and a channel layer made of an amorphous silicon film has been proposed. According to this structure, the two-layer structure of the channel layer including the channel layer made of the crystalline silicon film and the channel layer made of the amorphous silicon film ideally allows achieving a characteristic having a higher on-current compared to the channel layer made of single-layer amorphous silicon film, and a lower off-current compared to the channel layer made of single-layer crystalline silicon film, due to mutual advantages.

However, when the driving current (mobility) of the TFT is increased using the crystalline silicon film as one of the two layers (lower layer) in the channel layer in the TFT, the off-current of TFT increases. Although it is necessary to increase the thickness of the amorphous silicon film in another layer (upper layer) in order to suppress the off-current, there is a problem that the mobility of the TFT in appearance is reduced, reducing the driving capacity.

In addition, when driving the organic EL display device, a particularly low off-current is required for the switching transistor, and securing a current (mobility) for driving the organic EL element, that is, on-current is required for the driving transistor. However, it is difficult to achieve both of the requirements in one TFT manufacturing process. As a result, manufacturing the switching transistors and the driving transistors in the organic EL display device in separate processes makes the manufacturing process more complex, increasing the manufacturing cost.

The present invention has been conceived in view of the problems described above, and it is an object of the present invention to provide a light-emitting display device capable of suppressing the off-current in the switching transistor and securing the on-current in the driving transistor, and the manufacturing method for the light-emitting display device.

In order to achieve the object above, the light-emitting display device according to an aspect of the present invention, the side-contact structure is adopted in order to secure the TFT characteristics (on-current) in the linear region. In the TFT composing the switching transistor, the thickness of the semiconductor layer (channel layer) in a region corresponding to the source/drain electrode is increased in order to suppress off-current. In contrast, in the TFT composing the driving transistor, the thickness of the semiconductor layer (channel layer) in a region corresponding to the source/drain electrode is reduced in order to secure on-current.

According to the present invention, a light-emitting display device and the manufacturing method thereof capable of suppressing off-current in the switching transistor, and securing on-current in the driving transistor can be implemented. In addition, effects of reducing off-current and securing on-current of TFT composing the switching transistor while securing the on-current of TFT composing the driving transistor with the same number of process as the conventional technology.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings:

FIG. 4D is a diagram for illustrating the manufacturing method for the light-emitting display device according to the embodiment;

FIG. 4E is a diagram for illustrating the manufacturing method for the light-emitting display device according to the embodiment;

FIG. 4F is a diagram for illustrating the manufacturing method for the light-emitting display device according to the embodiment;

FIG. 4G is a diagram for illustrating the manufacturing method for the light-emitting display device according to the embodiment;

FIG. 4H is a diagram for illustrating the manufacturing method for the light-emitting display device according to the embodiment;

FIG. 4I is a diagram for illustrating the manufacturing method for the light-emitting display device according to the embodiment;

FIG. 4J is a diagram for illustrating the manufacturing method for the light-emitting display device according to the embodiment;

FIG. 5A is a diagram for illustrating a process for adjusting the thickness of the amorphous silicon film 15 in a switching transistor 1 region;

FIG. 5B is a diagram for illustrating the process for adjusting the thickness of the amorphous silicon film 15 in a driving transistor region 2;

FIG. 6A is a diagram for illustrating a process for adjusting the thickness of the amorphous silicon film 15 in a switching transistor region 1;

FIG. 6B is a diagram for illustrating the process for adjusting the thickness of the amorphous silicon film 15 in a driving transistor region 2;

DESCRIPTION OF THE PREFERRED EMBODIMENT

Figure 1A:
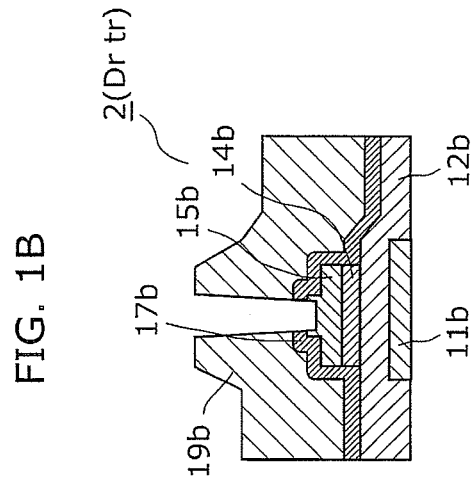
FIG. 1A is a cross-sectional view schematically illustrating a configuration of Sw Tr included in a light-emitting display device according to an embodiment.

The light-emitting display device according to the first aspect is a light-emitting display device comprising: an array of a plurality of light-emitting pixels; in which each of the light-emitting pixels includes a first thin film transistor, a second thin film transistor, and a light-emitting element, each of the first thin film transistor and the second thin film transistor includes: a gate electrode provided on the substrate; a gate insulating film provided on the gate electrode; a semiconductor layer provided on the gate insulating film corresponding to the gate electrode, and having a source region, a channel region, and a drain region; a doped semiconductor layer provided to cover upper surfaces of the source region and the drain region of the semiconductor layer; and source/drain electrodes provided on the doped semiconductor layer, a thickness of the source region and the drain region of the semiconductor layer in the first thin film transistor is greater than a thickness of the source region and the drain region of the semiconductor layer in the second thin film transistor.

According to this aspect, it is possible to form a TFT which requires reduced off-current (for example, switching transistor) and a TFT which requires a current value equal to or higher than a predetermined value in the saturation region (for example, the driving transistor) with a simple structure on the same substrate, using the same stacked structure and by merely changing the thickness of the side contacts of the semiconductor layer.

In the light-emitting display device according to the second aspect, the doped semiconductor layer covers side surfaces of channel-lengthwise ends of the semiconductor layer.

The light-emitting display device according to the third aspect further includes a plurality of data lines; and a power line for supplying current to the light-emitting pixels, which are arranged on a substrate, data voltage is applied to the gate electrode of the second thin film transistor from a corresponding one of the data lines, and current according to the applied voltage is supplied to the light-emitting element from the power line through the second thin film transistor.

The light-emitting display device according to the fourth aspect further includes a plurality of scanning lines on the substrate, in which the gate electrode of the first thin film transistor is connected to a corresponding one of the scanning lines, and a scanning signal is supplied to the gate electrode through the corresponding scanning line, and one of the source/drain electrodes of the first thin film transistor is connected to the gate electrode of the second thin film transistor, and data voltage is applied from the corresponding data line through the first thin film transistor to which the scanning signal is supplied.

In the light-emitting display device according to the fifth aspect, the semiconductor layer includes: a first semiconductor layer provided on the gate insulating film; and a second semiconductor layer provided on the first semiconductor layer, the first semiconductor layer is made of crystalline semiconductor, and the second semiconductor layer is made of amorphous semiconductor.

In the light-emitting display device according to the sixth aspect, the thickness of the source region and the drain region of the first semiconductor layer in the first thin film transistor is identical to the thickness of the source region and the drain region of the first semiconductor layer in the second thin film transistor, and the thickness of the source region and the drain region of the second semiconductor layer in the first thin film transistor is greater than the thickness of the source region and the drain region of the second semiconductor layer in the second thin film transistor.

In the light-emitting display device according to the seventh aspect, a thickness of the channel region of the semiconductor layer in the second thin film transistor is identical to the thickness of the semiconductor layer in the first thin film transistor, the channel region being a region other than the source region and the drain region of the semiconductor layer in the second thin film transistor.

In the light-emitting display device according to the eighth aspect, in the semiconductor layer in the second thin film transistor, the thickness of the channel region which is other than the source region and the drain region is greater than the thickness of the source region and the drain region.

According to this aspect, the thickness of the ends of the semiconductor layer in the source region and the drain region on the channel region side is relatively large. Thus, the field formed at the ends is reduced, preventing the breakdown due to electric field concentration.

In the light-emitting display device according to the ninth aspect, the semiconductor layer in the second thin film transistor is formed such that the thickness of the source region and the drain region and the thickness of the channel region change discontinuously.

In the light-emitting display device according to the tenth aspect a thickness of the source region and the drain region of the semiconductor layer in the second thin film transistor is adjusted at the time of forming, by etching using a multi-tone mask.

In the light-emitting display device according to the eleventh aspect, the light-emitting element is an organic electroluminescent element.

The manufacturing method for a light-emitting display device according to the twelfth aspect is a manufacturing method for a light-emitting display device including: an array of a plurality of light-emitting pixels; a plurality of data lines; and a power line for supplying current to the light-emitting pixels, which are arranged on a substrate, and each of the light-emitting pixels including a first thin film transistor, a second thin film transistor, and a light-emitting element, said manufacturing method including: forming, on the substrate, gate electrodes of the first and second thin film transistors; forming, on the gate electrodes, gate insulating films of the first and second thin film transistors; forming, on the gate insulating films, semiconductor layers of the first and second thin film transistors such that a thickness of a source region and a drain region of a semiconductor layer in the second thin film transistor is smaller than a thickness of a source region and a drain region of a semiconductor layer in the first thin film transistor; forming, on the semiconductor layers, doped semiconductor layers of the first and second thin film transistors; and forming, on the doped semiconductor layers, source/drain electrodes of the first and second thin film transistors, the gate electrode of the second thin film transistor is configured such that data voltage is applied from a corresponding one of the data lines, and the light-emitting element is configured such that current according to the applied voltage is supplied from the power line through the second thin film transistor.

In the manufacturing method for a light-emitting display device according to the thirteenth aspect, the thickness of the semiconductor layer in the second thin film transistor is adjusted at the time of forming, by etching using a multi-tone mask.

Embodiment 1

Figure 1B:
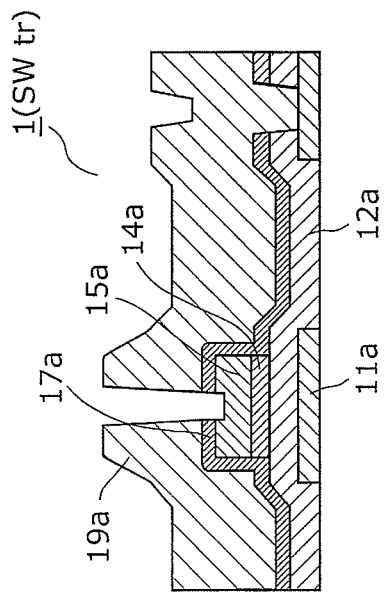
FIG. 1B is a cross-sectional view schematically illustrating a configuration of Dr Tr included in the light-emitting display device according to the embodiment.

FIG. 1A is a cross-sectional view schematically illustrating the configuration of Sw Tr included in the light-emitting display device according to the embodiment 1. FIG. 1B is a cross-sectional view schematically illustrating the configuration of Dr Tr included in the light-emitting display device according to the embodiment 1.

The switching transistor 1 (denoted as Sw Tr in the diagram) corresponds to the first thin film transistor according to the present invention. As illustrated in FIG. 1A, the switching transistor 1 is an inversely-staggered TFT, and includes an insulating substrate 10 (not illustrated), a gate electrode 11a, a gate insulating film 12a, a semiconductor layer including a crystalline silicon film 14a and an amorphous silicon film 15a, an n+ silicon film 17a, and source/drain electrodes 19a.

The insulating substrate 10 is a substrate made of clear glass or quartz.

The gate electrode 11a is provided on the insulating substrate 10, and is made of metal such as molybdenum (Mo) or Mo alloy, metal such as titanium (Ti), aluminum (Al), or Al alloy, metal such as copper (Cu) or Cu alloy, or a metal such as silver (Ag), chromium (Cr), tantalum (Ta), or tungsten (W).

The gate insulating film 12a is provided on the gate electrode 11a. More specifically, the gate insulating film 12a is formed to cover the gate electrode 11a, and is made of silicon oxide ($SiO_x$), silicon nitride ($SiN_x$), or a stacked structure of silicon oxide ($SiO_x$) and silicon nitride ($SiN_x$). In addition, the gate insulating film 12a is formed to have a thickness approximately between 75 nm and 500 nm, for example.

The semiconductor layer is provided on the gate insulating film 12a, and includes a crystalline silicon film 14a which is a crystalline semiconductor and an amorphous silicon film 15a which is an amorphous semiconductor. In addition, this semiconductor layer includes a source region and a drain region in regions corresponding to the source/drain electrodes 19a, and a channel region in a region other than the source region and the drain region, and serves as a channel layer. More specifically, the semiconductor layer (channel layer) includes the amorphous silicon film 15a stacked on the crystalline silicon film 14a having the source region, the channel region, and the drain region provided, corresponding to the gate electrode 11a on the gate insulating film 12a. The thickness of the channel layer (semiconductor layer) of the switching transistor 1 in the source region and the drain region is greater than the thickness of the channel layer (semiconductor layer) of the driving transistor 2 in the source region and the drain region.

The crystalline silicon film 14a corresponds to the first semiconductor layer according to the present invention, and is formed on the gate insulating film 12a. The crystalline silicon film 14a is a polycrystalline silicon film formed on the gate insulating film 12a, and has a thickness of 30 nm, for example. The crystalline silicon film 14a is formed by forming the amorphous silicon film 13 (not illustrated) on the gate insulating film 12a, and changing the formed amorphous silicon film 13 into a polycrystalline film (including fine-crystallization) by laser. Note that, the term "polycrystalline" here is used in a broader sense, including not only the polycrystals in a narrow sense including crystals of 50 nm or larger, but also the fine crystals in a narrow sense including crystals of 50 nm or smaller. The term "polycrystalline" in the following description is used in the broader sense.

The amorphous silicon film 15a corresponds to the second semiconductor layer according to the present invention, and is an amorphous silicon film, for example, formed on the crystalline silicon film 14a. The thickness of the amorphous silicon film 15a is, for example, 75 nm.

The n+ silicon film 17a is a doped semiconductor layer provided to cover the upper surface of the source region and the drain region of the semiconductor layer (amorphous silicon film 15a and the gate insulating film 12a), and serves as the contact layer. More specifically, the n+ silicon film 17a is formed to cover the amorphous silicon film 15a and the gate insulating film 12a.

In addition, the n+ silicon film 17a is provided to cover the side surfaces of the crystalline silicon film 14a and the amorphous silicon film 15a. In other words, the n+ silicon film 17a is provided to cover the side surfaces on both sides opposite to the channel length direction of the channel layer (the semiconductor layer, that is, the crystalline silicon film 14a and the amorphous silicon film 15a). With the arrangement described above, the n+ silicon film 17a functions as a side contact electrically conducting the source/drain electrode 19a and the channel layer. Here, the thickness of the n+ silicon film 17a is, for example, 25 nm.

The source/drain electrode 19a is provided on the n+ silicon film 17a. The source/drain electrode 19a is made of, for example, metal such as molybdenum (Mo) or Mo alloy, metal such as titanium (Ti), aluminum (Al), or Al alloy, metal such as copper (Cu) or Cu alloy, or a metal such as silver (Ag), chromium (Cr), tantalum (Ta), or tungsten (W).

The switching transistor 1 is configured as described above.

The driving transistor 2 (denoted as Dr Tr in the diagram) corresponds to the second thin film transistor according to the present invention. As illustrated in FIG. 1B, the driving transistor 2 is an inversely-staggered TFT, and includes an insulating substrate 10 (not illustrated), a gate electrode 11b, a gate insulating film 12b, a semiconductor layer including a crystalline silicon film 14b and an amorphous silicon film 15b, an n+ silicon film 17b, and source/drain electrodes 19b.

The insulating substrate 10 is a substrate made of clear glass or quartz.

The gate electrode 11b is provided on the insulating substrate 10, and is made of a metal same as the metal of the gate electrode 11a. The gate electrode 11b is made of, for example, metal such as molybdenum (Mo) or Mo alloy, metal such as titanium (Ti), aluminum (Al), or Al alloy, metal such as copper (Cu) or Cu alloy, or a metal such as silver (Ag), chromium (Cr), tantalum (Ta), or tungsten (W).

The gate insulating film 12b is provided on the gate electrode 11b. More specifically, the gate insulating film 12b is made of the same material as the gate insulating film 12a, and is formed to cover the gate electrode 11b. More specifically, the gate insulating film 12b is made of the same material as the gate insulating film; that is, made of silicon oxide ($SiO_x$), silicon nitride ($SiN_x$), or a stacked structure of silicon oxide ($SiO_x$) and silicon nitride ($SiN_x$). In addition, the gate insulating film 12b is formed to have a thickness approximately between 75 nm and 500 nm, for example.

The semiconductor layer is provided on the gate insulating film 12b, and includes the crystalline silicon film 14b and the amorphous silicon film 15b. In addition, this semiconductor layer includes a source region and a drain region in regions corresponding to the source/drain electrodes 19a, and a channel region in a region other than the source region and the drain region, and serves as a channel layer. More specifically, the semiconductor layer (channel layer) is formed corresponding to the gate electrode 11b on the gate insulating film 12b, and the amorphous silicon film 15b is stacked on the crystalline silicon film 14b having the source region, the channel region, and the drain region. The thickness of the semiconductor layer (channel layer) of the driving transistor 2 in the source region and the drain region is thinner (smaller) than the thickness of the semiconductor layer (channel layer) of the switching transistor 1. As described above, the thickness of the semiconductor layer (channel layer) in the channel region (central part) is relatively greater than the thickness of the semiconductor layer (channel layer) in the source region and the drain region. Thus, the electric field formed at the semiconductor layer (channel layer) is reduced, preventing the breakdown due to electric field concentration. In other words, the off-current can be suppressed.

The crystalline silicon film 14b is formed on the gate insulating film 12b. The crystalline silicon film 14b is a polycrystalline silicon film formed on the gate insulating film 12b, and has a thickness of 30 nm, for example. The crystalline silicon film 14b is formed by forming the amorphous silicon film 13 (not illustrated), and changing the formed amorphous silicon film 13 into a polycrystalline film (including micro-crystallization) by laser.

The amorphous silicon film 15b is an amorphous silicon film, for example, formed on the crystalline silicon film 14b. The thickness of the amorphous silicon film 15b is 30 nm in the source region and the drain region, for example, and is 75 nm in the channel region, for example. As described above, the thickness of the source region and the drain region of the semiconductor layer (here, the amorphous silicon film 15b) in the driving transistor 2 changes discontinuously from the channel region side (central part of the semiconductor layer) to the opposite side of the channel region (peripheral part of the semiconductor layer). In other words, the semiconductor layer in the driving transistor 2 is formed such that the thickness of the source region and the drain region and the thickness of the channel region change discontinuously. More specifically, the thickness of the amorphous silicon film 15b in the region corresponding to the source/drain electrode 19b is formed to be thinner than the region corresponding to the source/drain electrode 19a in the amorphous silicon film 15a in the switching transistor 1, and the thickness of the amorphous silicon film 15b is identical to the amorphous silicon film 15a in a region corresponding to the gate region 11b (channel region) in the amorphous silicon film 15a in the switching transistor 1.

The n+ silicon film 17b is a doped semiconductor layer provided to cover the upper surfaces of the source region and the drain region of the semiconductor layer (amorphous silicon film 15b and the gate insulating film 12b), and serves as the contact layer. More specifically, the n+ silicon film 17b is formed to cover the amorphous silicon film 15b and the gate insulating film 12b.

In addition, the n+ silicon film 17b is provided to cover the side surfaces of the crystalline silicon film 14b and the amorphous silicon film 15b. In other words, the n+ silicon film 17b is provided to cover the side surfaces on channel lengthwise ends of the channel layer (the semiconductor layer, that is, the crystalline silicon film 14b and the amorphous silicon film 15b). With the arrangement described above, the n+ silicon film 17b functions as a side contact electrically conducting the source/drain electrode 19b and the channel layer. Here, the thickness of the n+ silicon film 17b is, for example, 25 nm.

The source/drain electrode 19b is provided on the n+ silicon film 17b, and is made of the same material as the source/drain electrode 19a. The source/drain electrode 19b is made of, for example, metal such as molybdenum (Mo) or Mo alloy, metal such as titanium (Ti), aluminum (Al), or Al alloy, metal such as copper (Cu) or Cu alloy, or a metal such as silver (Ag), chromium (Cr), tantalum (Ta), or tungsten (W).

The driving transistor 2 is configured as described above.

Figure 2:
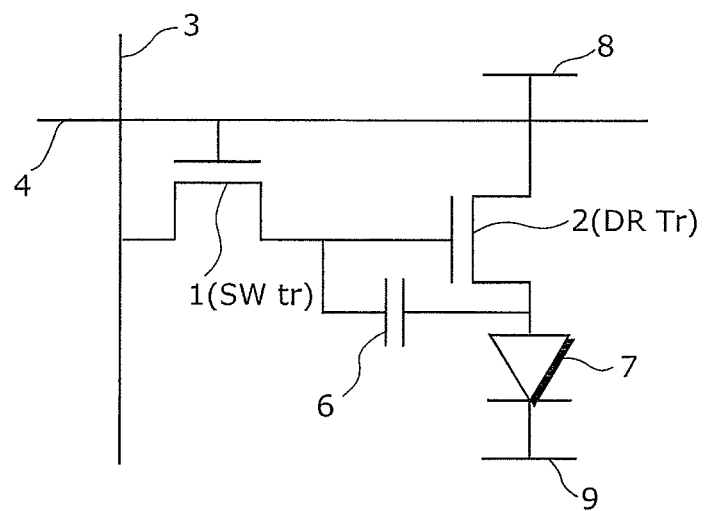
FIG. 2 is a diagram illustrating an equivalent circuit of the light-emitting display device according to the embodiment.

FIG. 2 is a diagram illustrating an equivalent circuit of the light-emitting display device according to the embodiment. The light-emitting display device illustrated in FIG. 2 includes light-emitting pixels arranged on an insulating substrate 10, and displays images based on the video signal which is luminance signals input to the light-emitting display device from outside. The following shall describe the details of the circuit configurations of each of the light-emitting pixels included in the light-emitting display device. Each of the light-emitting pixels includes a switching transistor 1, a driving transistor 2, a data line 3, a scanning line 4, a high-voltage power line 8, a low-voltage power line 9, a capacitor 6, and an organic EL element 7.

The switching transistor 1 has one of source/drain electrodes 19*a* connected to the data line 3, and the other of source/drain electrodes 19*a* is connected to the capacitor 6, and the gate electrode 11*a* is connected to the scanning line 4. The switching transistor 1 switches a connection between the data line 3 and the capacitance 6 between conduction and non-conduction, when a scanning signal is supplied through the scanning line 4.

The driving transistor 2 has a gate electrode 11*b* connected to one of the source/drain electrodes 19*a* of the switching transistor 1, and is connected to the data line 3 via the switching transistor 1. Furthermore, the driving transistor 2 has one of the source/drain electrodes 19*b* (source electrode) connected to an anode of the organic EL element 7, and the other of the source/drain electrode 19*b* (drain electrode) connected to the high-voltage power line 8. A data voltage is applied from the data line 3 to the gate electrode 11*b* of the driving transistor 2 through the switching transistor 1, and a current according to the applied data voltage flows in the organic EL element 7, causing the organic EL element 7 to emit light.

Here, the high-voltage power line 8 is a power line for supplying a large current to the driving transistor 2 and the organic EL element 7. The voltage supplied to the high-voltage power line is Vdd, and is, for example, 20 V.

The data line 3 is a line for transmitting a data voltage which determines the brightness of the pixel in the organic EL element 7 (the value of voltage) to each of the light-emitting pixels.

The scanning line 4 is a line used for transmitting the scanning signal which determines switching of the switching transistor 1 (ON/OFF) to each of the light-emitting pixels.

The capacitor 6 holds the voltage value (electric charges) for a given period of time.

The organic EL element 7 corresponds to the light-emitting element in the present invention, and emits light when receiving the driving current from the driving transistor 2. More specifically, the organic EL element 7 emits light when receiving a supply of current (driving current) from the high-voltage power line 8 through the driving transistor 2. The organic EL element 7 has a cathode connected to the low-voltage power line 9, and an anode connected to the source electrode of the driving transistor 2. Here, the voltage supplied to the low-voltage power line 9 is Vss, and is 0 V, for example.

Next, the manufacturing method of the light-emitting display device with the configuration described above shall be described.

Figure 3:
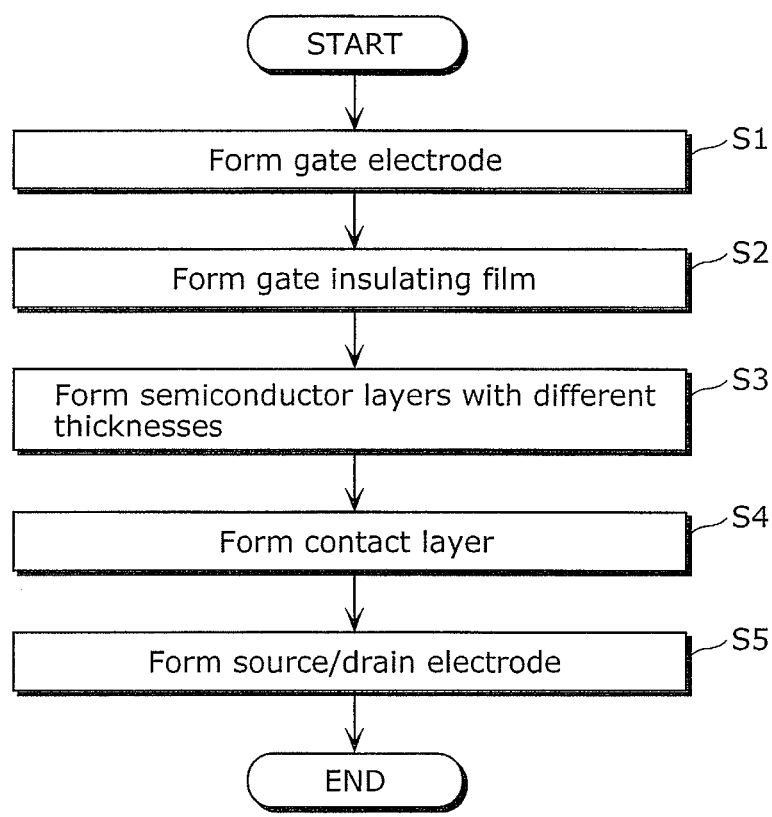
FIG. 3 is a flowchart illustrating the manufacturing process of the light-emitting display device according to the embodiment.

FIG. 3 is a flowchart illustrating the manufacturing process of the light-emitting display device according to the embodiment of the present invention. FIGS. 4A to 4J are diagrams for illustrating the manufacturing method for the light-emitting display device according to the embodiment of the present invention.

First, the gate electrodes of the switching transistor 1 and the driving transistor 2 are formed on the insulating substrate 10 (S1).

Figure 4A:
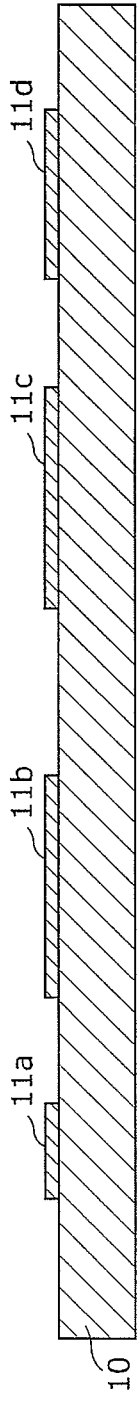
FIG. 4A is a diagram for illustrating the manufacturing method for the light-emitting display device according to the embodiment.

More specifically, a MoW metal film 11 is deposited by the sputtering method on the insulating substrate 10, for example, and a gate electrode 11*a* in the switching transistor region 1, the gate electrode 11*b* in the driving transistor 2 region, the electrode 11*c* in the capacitor 6, and the metal 11*d* in the line part are formed by photolithography and etching (FIG. 4A). Here, the metal 11*d* in the line part includes lines such as the data line 3, the scanning line 4, the high-voltage power line 8, and the low-voltage power line 9. In addition, the region in which the switching transistor 1 is formed after the manufacturing process is referred to as the switching transistor 1 region, and the region in which the driving transistor 2 is formed after the manufacturing process is referred to as the driving transistor 2 region.

Next, the gate insulating film 12 for the switching transistor 1 and the driving transistor 2 are formed on the gate electrodes (S2). Subsequently, the semiconductor layers for the switching transistor 1 and the driving transistor 2 are formed on the gate insulating films 12. The semiconductor layers have different thicknesses, and the thickness of the semiconductor layer in the switching transistor 1 in the source region and the drain region is greater than the thickness of the semiconductor layer in the driving transistor 2 in the source region and the drain region (S3).

Figure 4B:
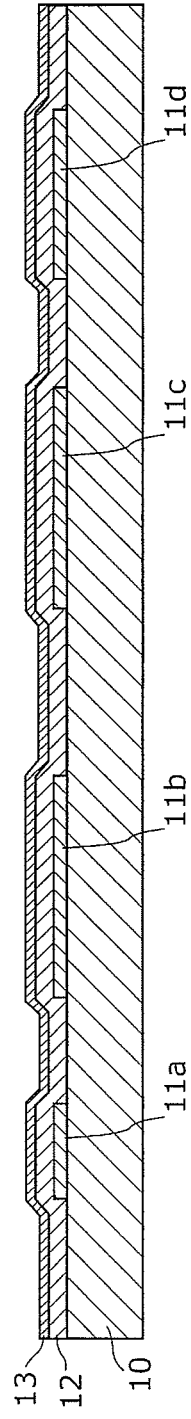
FIG. 4B is a diagram for illustrating the manufacturing method for the light-emitting display device according to the embodiment.

More specifically, by the plasma CVD, the gate insulating film 12 is formed on the gate electrode 11*a*, the gate electrode 11*b*, the electrode 11*c* and the metal 11*d*, that is, covering the insulating substrate 10, the gate electrode 11*a*, the gate electrode 11*b*, and the electrode 11*c*, and the metal 11*d*, and the amorphous silicon film 13 is continuously formed on the formed gate insulating film 12 (FIG. 4B).

Figure 4C:
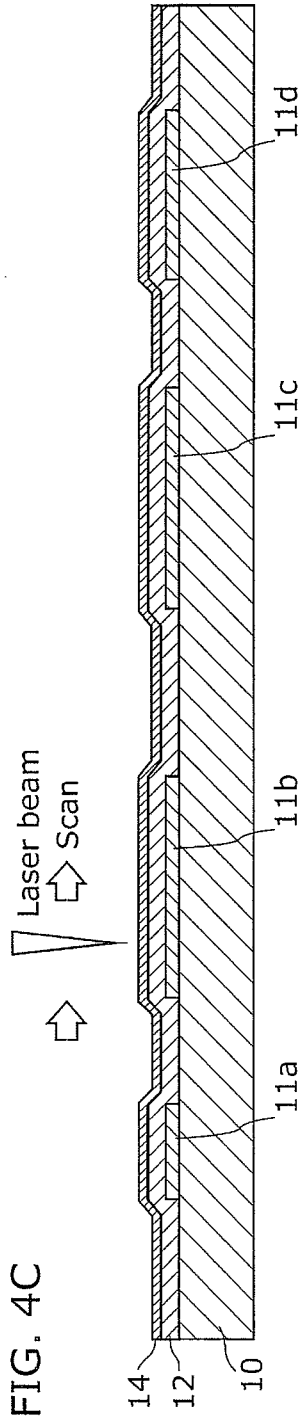
FIG. 4C is a diagram for illustrating the manufacturing method for the light-emitting display device according to the embodiment.

Here, the gate insulating film 12 is, for example has a stacked structure of silicon oxide ($SiO_2$) and silicon nitride ($SiN_x$). In addition, the gate insulating film 12 is formed to have a thickness approximately between 75 to 500 nm, and the amorphous silicon film 13 is formed to have a thickness of 30 nm, for example. Subsequently, the amorphous silicon film 13 is changed to the crystalline silicon film 14 by the laser annealing. More specifically, the formed amorphous silicon film 13 is dehydrated, and subsequently changing the amorphous silicon film 13 into poly-crystals (including micro crystals) by laser to form the crystalline silicon film 14 (FIG. 4C).

Subsequently, the amorphous silicon film 15 is formed on the formed crystalline silicon film 14, and the thickness of the channel layer region (semiconductor region) is adjusted by etching using a high-tone mask.

More specifically, by the plasma CVD, the amorphous silicon film 15 is formed on the crystalline silicon film 14, and a photoresist 16 is applied on the formed amorphous silicon film 15. Here, the amorphous silicon film 15 is formed to have a thickness of approximately 75 nm, for example. Subsequently, using the SC mask, for example, the high-tone mask such as the half-tone mask, the applied photoresist is exposed (FIG. 4D), and etching is performed on the crystalline silicon film 14 and the amorphous silicon film 15. Here, dry etching is used as the etching. As the gas for etching, for example, gas including fluorine (F), chlorine (Cl), or a mixed gas of F and Cl is used. The SC mask is a mask for simultaneously patterning the crystalline silicon film 14 and the amorphous silicon film 15, and a high-tone mask such as the half-tone mask is used here.

With this, leaving the region in the switching transistor 1 region (a region which becomes a semiconductor layer) to be the channel layer and the region in the driving transistor 2 region (a region which becomes a semiconductor layer) to be the channel layer, and the region in the switching transistor 1 region to be the channel layer (a region which becomes the semiconductor layer) and the region in the driving transistor 2 region to be the channel layer (the region which becomes the semiconductor layer) with different thicknesses (FIG. 4E).

Here, the process for forming the semiconductor layer with different thicknesses on the gate insulating film 12 shall be described in detail with reference to the drawings. FIGS. 5A, 5B, 6A, and 6B are diagrams for illustrating the process for forming the semiconductor layer with different thicknesses on the gate insulating film 12 in detail. FIGS. 5A and 6A are diagrams for illustrating the process for adjusting the thickness of the amorphous silicon film 15 in the switching transistor 1 region, and FIGS. 5B and 6B are diagrams for illustrating the process for adjusting the thickness of the amorphous silicon film 15 in the driving transistor 2 region.

As illustrated in FIG. 5A, in the switching transistor 1 region, the applied photoresist is exposed by the high-tone mask, leaving the photoresist 16a covering the entire channel layer region for the approximately same thickness. In contrast, as illustrated in FIG. 5B, in the driving transistor 2 region, the applied photoresist is exposed by the high-tone mask, leaving the photoresist 16b serving as the half-tone mask. More specifically, the remaining photoresist 16b has the same thickness as the photoresist 16a in the region inside the channel layer region, and thinner than the photoresist 16a in a region outside of the channel layer, and serves as the half-tone mask.

Next, dry etching is performed. Subsequently, in the switching transistor 1 region, as illustrated in FIG. 6A, the crystalline silicon film 14a and the amorphous silicon film 15a in the channel layer region remain with the thickness at the time of forming. More specifically, in the switching transistor 1 region, the thickness of the crystalline silicon film 14a remains as 30 nm, and the thickness of the amorphous silicon film 15a remains as 75 nm. On the other hand, in the driving transistor 2 region, the photoresist 16b serves as a half-tone mask for etching amorphous silicon film 15b such that the thickness of the amorphous silicon film 15b in the region inside of the channel layer region and the thickness of the amorphous silicon film 15b in the region outside of the channel layer region are different from each other. More specifically, as illustrated in FIG. 6B, although the crystalline silicon film 14b remains with the thickness at the time of forming, the thickness of the amorphous silicon film 15b is different in the region outside of the channel layer region and inside the channel layer region. In other words, in the driving transistor 2 region, the thickness of the crystalline silicon film 14b is 30 nm, which is the same as the thickness of the amorphous silicon film 14a in the switching transistor 1 region. On the other hand, the thickness of the amorphous silicon film 15b is 30 nm in the region outside of the channel layer region, and is 75 nm inside the channel layer region, which is the same as the thickness of the amorphous silicon film 15a in the switching transistor 1 region. As described above, using the high-tone mask such as the half-tone mask, the channel layer region is formed such that the thicknesses of the channel layer region in the switching transistor 1 region (more specifically, the amorphous silicon film 15a) and the thickness of the channel layer region in the driving transistor 2 region (more specifically, the amorphous silicon film 15b) are different.

Next, the doped semiconductor layers, that is, the contact layers of the switching transistor 1 and the driving transistor 2 are formed on the semiconductor layer (S4).

More specifically, first, the photoresist 16a and the photoresist 16b are detached, and wet cleaning is performed. Subsequently, a doped semiconductor layer, that is, an n+ silicon film 17 is formed by forming the amorphous silicon film with the plasma CVD, and by doping an element of group V such as phosphorus (P). Here, the n+ silicon film 17 is formed with the thickness of 25 nm, for example, and serves as a contact layer.

Next, the photoresist 18 is applied to the formed n+ silicon film 17 (contact layer) and the contact layer is exposed. After the exposure, the photoresist 18 in the region to be etched is detached (ashing) (FIG. 4F). Subsequently, etching is performed on the n+ silicon film 17 (contact layer) and the gate insulating film 12 to be etched (FIG. 4G). Here, dry etching is used as the etching. When performing the dry etching on the n+ silicon film 17 (contact layer), a mixed gas of the sulfur hexafluoride ($SF_6$) and chlorine (Cl) is used, for example. When performing the dry etching on the gate insulating film 12, the mixed gas of carbon trifluoride ($CF_3$) and oxygen (O) is used when the gate insulating film 12 is made of $SiO_2$, and a mixed gas of sulfur hexafluoride ($SF_6$), oxygen (O), and helium (He) is used when the gate insulating film 12 is made of SiN. After the etching, the photoresist 18 is detached.

Next, the source/drain electrodes of the switching transistor 1 and the driving transistor 2 are formed on the doped semiconductor layer (S5).

More specifically, the metal 19 is deposited by sputtering on the formed n+ silicon film 17 (more specifically, on the n+ silicon film 17 and the etched and exposed gate electrode 11b, the electrode 11c, and the metal 11d). Here, the deposited metal 19 is, for example, MoW/Al-0.5 wt % Cu/MoW:80 nm/300 nm/20 nm. Subsequently, the photoresist 20 is applied and exposure is performed on the deposited metal 19, and the photoresist on the region to be etched is detached (ashing) (FIG. 4H). Subsequently, etching is performed on the metal 19 in the region to be etched (FIG. 4I). Here, wet etching is used for the etching, and mixed acid such as aqua regia is used as the etching solution.

Subsequent to the etching on the metal 19, dry etching on the n+ silicon film 17 in the region to be etched (contact layer), part of the amorphous silicon film 15a in the switching transistor 1 region, and part of the amorphous silicon film 15b in the driving transistor 2 region is performed. Here, as the dry etching gas, the mixed gas of sulfur hexafluoride ($SF_6$) and chlorine (Cl) is used, in the same manner as the description above.

Finally, the photoresist 20 is detached, and the light-emitting display device is manufactured (FIG. 4J).

As described above, in the light-emitting display device according the this embodiment, the switching transistor 1, the driving transistor 2, the capacitance 6 and the line part can be easily formed at the same time. In addition, in the light-emitting display device according to this embodiment, the thickness of the source region and the drain region of the semiconductor layer in the driving transistor 2 can be adjusted by the etching using the multi-tone mask (half-tone mask). In other words, using the half-tone mask as the SC mask, the switching transistor 1 and the driving transistor 2 having semiconductor layers with different thicknesses can be formed. With this, in the switching transistor 1, it is possible to reduce the off-current while securing on-current, and in the driving transistor 2, it is possible to secure a sufficient on-current.

In other words, with the same stacked structure, it is possible to form a TFT which requires reduction of off-current (switching transistor 1) and a TFT which requires securing a current value at a predetermined value or higher in the saturation region (driving transistor 2) on the same substrate with the simple structure merely by changing the thickness of the side contacts in the semiconductor layer.

Next, a principle on the effects achieving the reduction of the off-current while securing the on-current in the switching transistor 1 and securing the on-current in the driving transistor 2 in the light-emitting display device formed as described above shall be described.

Figure 7:
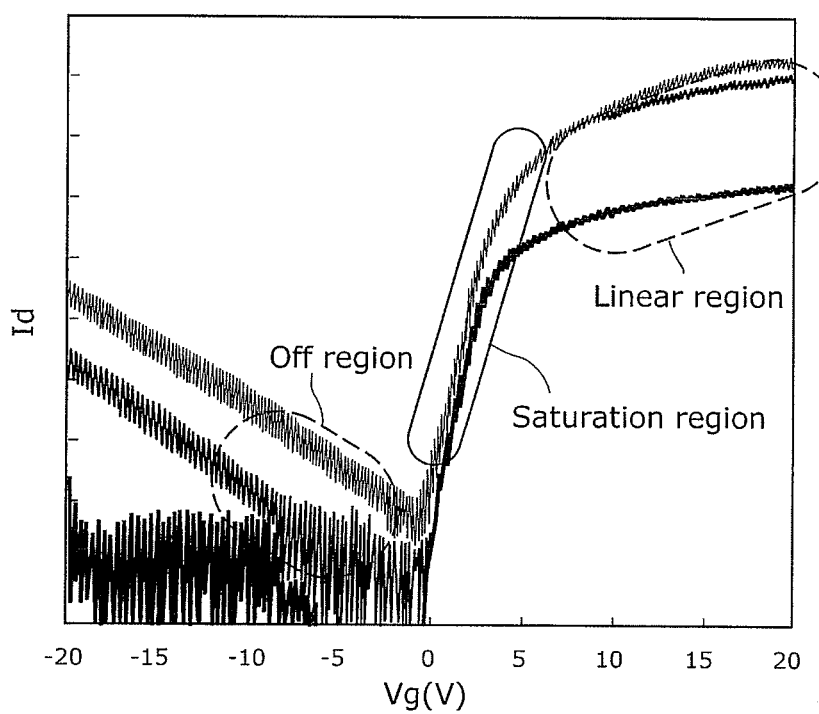
FIG. 7 is a graph illustrating TFT characteristics of a general TFT.
Figure 8:
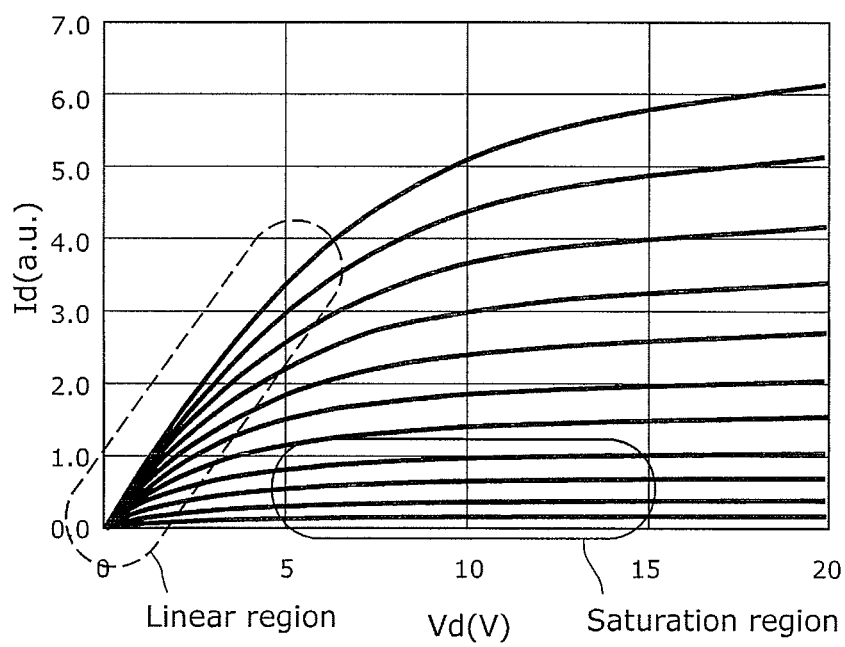
FIG. 8 is a graph illustrating TFT characteristics of a general TFT.

First, with reference to FIGS. 7 and 8, the TFT characteristics required for the switching transistor 1 and the driving transistor 2 shall be described. Here, FIGS. 7 and 8 are graphs illustrating the TFT characteristics of the general thin film transistor. More specifically, FIG. 7 illustrates the behavior of the drain current Id in relation to the drain current Id and the gate voltage Vg, that is, at a predetermined source-drain voltage (Vds) and varying gate voltages Vg. Note that, in FIG. 7, the vertical axis is the drain current Id, and the horizontal axis is the gate voltage Vg (V). On the other hand, FIG. 8 indicates the behavior of the drain current Id in relation to the drain current Id and the drain voltage Vd, that is, at a predetermined gate voltage Vg and varying drain voltage Vd. Here, the vertical axis indicates the drain current Id (A), and the horizontal axis indicates the drain voltage Vd (V).

The switching transistor 1 is basically used in the linear region illustrated in FIGS. 7 and 8 (the region indicated in dotted lines in the diagrams). Here, the linear region is a region in which the value of the gate voltage Vg from the threshold voltage Vth (Vg−Vth) exceeds the source-drain voltage (Vds). In other words, in the region, the drain voltage Vd is in proportion to the applied gate voltage Vg, and where Vg−Vth>Vds.

In addition, it is necessary for the switching transistor 1 to have an off-current in the off region as low as possible, for example, 1 pA or less in order to hold the electric charge written on the capacitor 6 as illustrated in FIG. 2.

On the other hand, the driving transistor 2 is basically used in the saturation region (the region illustrated in lines in the diagrams) illustrated in FIGS. 7 and 8. Here, the saturation region is a region in which the source-drain voltage (Vds) is greater than the value of the gate voltage Vg from the threshold voltage Vth (Vg−Vth). In addition, as illustrated in FIG. 2, the driving transistor 2 is used for supplying current to the organic EL element 7. For this reason, the driving transistor 2 has to supply the amount of current in a current range (0.5 nA to 5 µA) corresponding to the current-luminance characteristic of the organic EL element 7, although there is no requirement for the off-current as for the switching transistor 1. More specifically, it is necessary for the driving transistor 2 to secure the on-current in the current range in the saturation region.

Next, the TFT characteristic with or without side contact shall be described with reference to FIGS. 9A, 9B, 10A, and 10B.

Figure 9B:
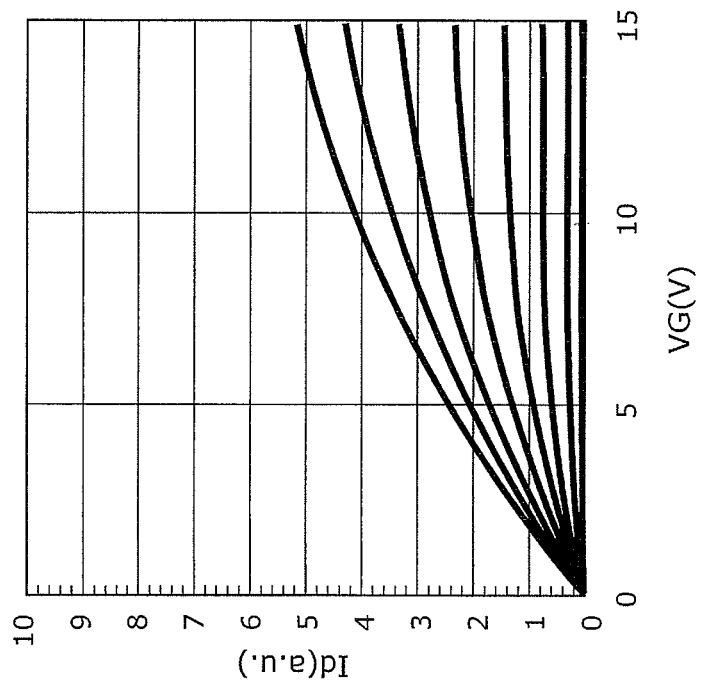
FIG. 9B illustrates characteristics in the TFT in FIG. 9A.
Figure 9A:
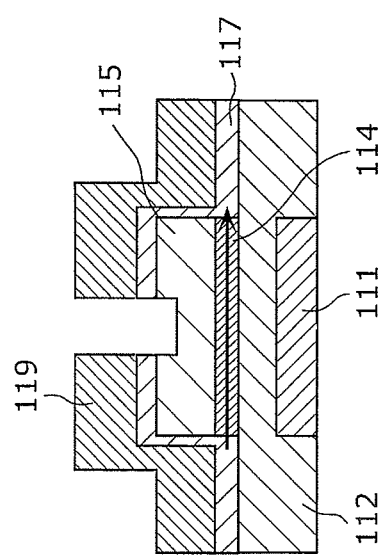
FIG. 9A illustrates a TFT with side contacts.
Figure 10B:
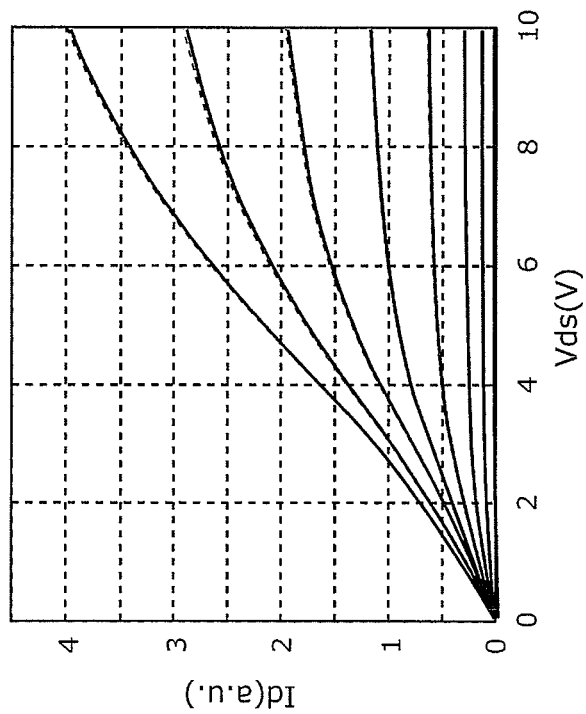
FIG. 10B illustrates TFT characteristics in the TFT structure illustrated in FIG. 10A.
Figure 10A:
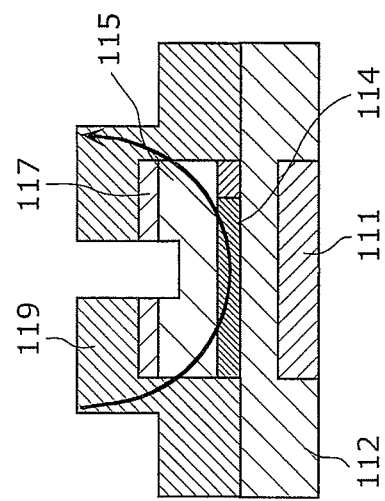
FIG. 10A illustrates a TFT structure without side contacts.

FIG. 9A is a diagram illustrating a TFT with side contacts. FIG. 9B is a diagram illustrating characteristics of TFT illustrated in FIG. 9A. FIG. 10A illustrates a TFT structure without a side contact. FIG. 10B illustrates TFT characteristics in the TFT structure illustrated in FIG. 10A.

The TFT illustrated in FIG. 9A is an inversely staggered TFT, and includes an insulating substrate 110 made of transparent glass or quartz (not illustrated), the gate electrode 111 provided on the insulating substrate 110, the gate insulating film 112 provided on the gate electrode 111, the crystalline silicon film 114 formed on the gate insulating film 112, the amorphous silicon film 115 formed on the crystalline silicon film 114, an n+ silicon film 117 provided to cover the side surfaces of the crystalline silicon film 114 and the amorphous silicon film 115, and the source/drain electrodes 119. FIG. 9B illustrates the relationship between the drain current Id and the gate voltage Vg, and the vertical axis indicates the drain current Id (A), and the behavior of the drain current Id in different source-drain voltage (Vds) and varying gate voltages Vg is illustrated. Note that, the vertical axis indicates the drain current Id, and the horizontal axis indicates the gate voltage Vg (V).

The TFT illustrated in FIG. 10A indicates the configuration without side contact, in which the crystalline silicon film 114 and the n+ silicon film 117 are not in contact with each other. More specifically, compared to the TFT illustrated in FIG. 9A, the length of the crystalline silicon film 114 (channel layer) is short, and the rest of the configuration is identical. Thus, the detailed description shall be omitted. FIG. 10B indicates a relationship between the drain currents Id and the drain voltages Vd, and indicates the behavior of the drain current Id at different gate voltages Vg and varying drain voltages Vd. Here, the vertical axis indicates the drain current Id (A), and the horizontal axis indicates the drain voltage Vd (V). FIG. 10B indicates a case in which the length for the crystalline silicon film 114 (channel layer) is varied into three different lengths.

As illustrated in FIGS. 9B and 10B, in the case of TFT without side contact illustrated in FIG. 10A, the current value in the linear region decreases. Accordingly, in the linear region, the current flows from the crystalline silicon film 114 (channel layer) through the side contact part (the part in which the crystalline silicon film 114 and the n+ silicon film 117 are in contact with each other). In contrast, in the saturation region, the reduction in the current value is not observed. Thus, the current flows in a part which is not the side contact part.

Accordingly, it is preferable to have the side contact to secure the on characteristics of the linear region. As described above, the switching transistor 1 is basically used in the linear region. Thus, it is preferable for the switching transistor to have the side contact. As described above, the switching transistor 1 and the driving transistor 2 according to the embodiment have the side contacts.

Figure 11:
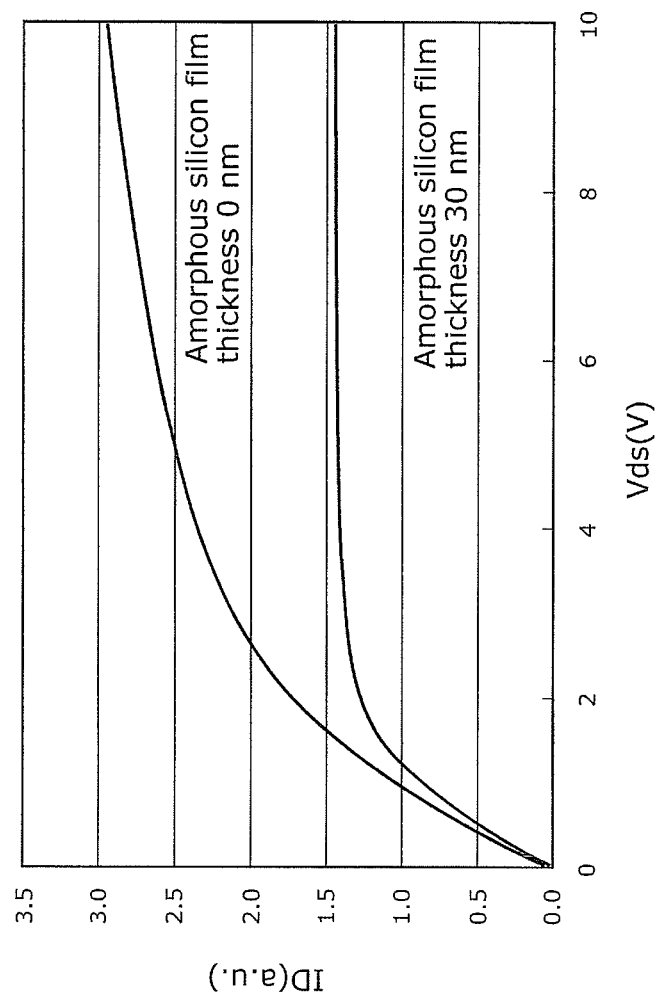
FIG. 11 is a diagram illustrating characteristics in varied thicknesses of the amorphous silicon film in the TFT illustrated in FIG. 10A.
Figure 12:
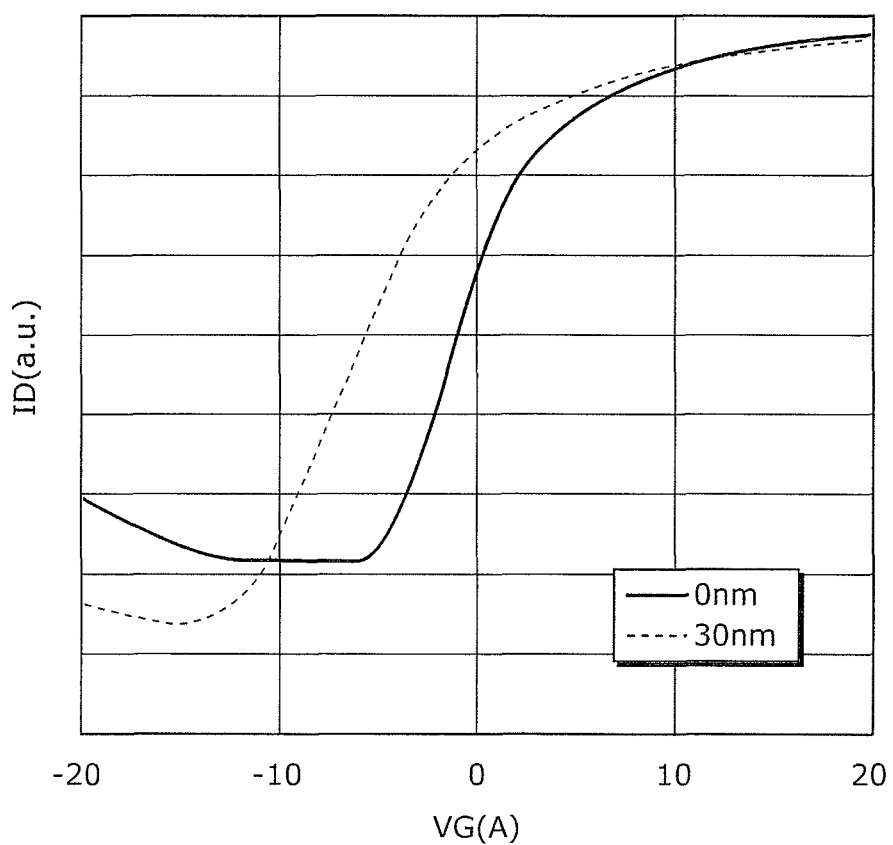
FIG. 12 is a diagram illustrating characteristics in varied thicknesses of the amorphous silicon film in the TFT illustrated in FIG. 10A.

Next, the current-voltage characteristics of in the TFT without side contact illustrated in FIG. 10A when the thickness of the amorphous silicon film 115 is changed shall be described. FIGS. 11 and 12 are diagrams illustrating characteristics in varied thicknesses of the amorphous silicon film in the TFT illustrated in FIG. 10A.

FIG. 11 indicates the relationship between the drain current Id and the drain voltage Vds, and the vertical axis indicates the drain current Id (A), and the horizontal axis indicates the drain voltage Vds (V). More specifically, the behavior of the drain current Id at a constant (2V) gate voltage Vg and varying drain voltage Vds when the thicknesses of the amorphous silicon film 115 is 0 nm and 30 nm is illustrated. FIG. 12 indicates the relationship between the drain current Id and the gate voltage Vg, and the vertical axis indicates the drain current Id (A). More specifically, the behavior of the drain current Id at a constant source-drain voltage (Vds) and varying gate voltage Vg when the thicknesses of the amorphous silicon films 115 are 0 nm, 10 nm, 20 nm, and 30 nm.

As illustrated in FIG. 11, when the thickness of the amorphous silicon film 115 increases, the current in the saturation region and the linear region, that is, the on-current decreases. In contrast, as illustrated in FIG. 12, when the thickness of the amorphous silicon film 115 increases, the current in the off region, the off-current decreases. More specifically, the increase in the thickness of the amorphous silicon film 115 is disadvantageous to the driving transistor 2 since the on-current decreases, but is advantageous to the switching transistor 1 since the off-current decreases.

Accordingly, as described above, in the switching transistor 1 in the embodiment 1, it is effective to increase the thickness of the amorphous silicon film 115 in the SD (source/drain) region in the amorphous silicon film 15a in order to reduce the off-current, and to decrease the thickness of the amorphous silicon film 115 in the SD region in the amorphous silicon film 15a in the driving transistor 2 in order to secure the on-current.

As described above, according to the light-emitting display device according to the present invention, it is possible to implement the switching transistor 1 and the driving transistor 2 having the semiconductor layers with different thicknesses in the amorphous silicon film in the SD region by using the half tone mask as the SC mask. In addition, the light-emitting display device has the side contacts, and thus the on-characteristics in the linear region are secured particularly in the switching transistor 1. More specifically, the switching transistor has the side contact structure for securing the on-current in the linear region, and the thickness of the amorphous silicon film 15a is thick in order to reduce the off-current. In contrast, in the driving transistor 2, the thickness of the amorphous silicon film 15b is thin in order to secure the on-current in the saturation region.

With this, in the light-emitting display device, the switching transistor 1 can reduce the off-current while securing the on-current, and the driving transistor 2 can secure a sufficient on-current.

Furthermore, the light-emitting display device according to the present invention is effective for securing sufficient on-current for the driving transistor while securing the on-current and reducing the off-current of the switching transistor 1 with the same number of process as conventional techniques.

Although only some exemplary embodiments of the light-emitting display device and the manufacturing method for the light-emitting display device according to the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be used for the light-emitting display device and the manufacturing method for the light-emitting display device, and particularly for a light-emitting display device such as liquid crystal display devices and organic EL display device and manufacturing methods thereof.

What is claimed is:

1. A light-emitting display device comprising:
an array of a plurality of light-emitting pixels;
a plurality of data lines; and
a power line for supplying current to the light-emitting pixels, which are arranged on a substrate,
wherein each of the light-emitting pixels includes a first thin film transistor, a second thin film transistor, and a light-emitting element,
each of the first thin film transistor and the second thin film transistor includes:
a gate electrode provided on the substrate;
a gate insulating film provided on the gate electrode;
a semiconductor layer provided on the gate insulating film corresponding to the gate electrode, and having a source region, a channel region, and a drain region;
a doped semiconductor layer provided to cover upper surfaces of the source region and the drain region of the semiconductor layer; and
source/drain electrodes provided on the doped semiconductor layer,
a thickness of the source region and the drain region of the semiconductor layer in the first thin film transistor is greater than a thickness of the source region and the drain region of the semiconductor layer in the second thin film transistor,
the doped semiconductor layer covers side surfaces of channel-lengthwise ends of the semiconductor layer,
data voltage is applied to the gate electrode of the second thin film transistor from a corresponding one of the data lines, and
current according to the applied voltage is supplied to the light-emitting element from the power line through the second thin film transistor.

2. The light-emitting display device according to claim 1, further comprising
a plurality of scanning lines on the substrate,
wherein the gate electrode of the first thin film transistor is connected to a corresponding one of the scanning lines, and a scanning signal is supplied to the gate electrode through the corresponding scanning line, and
one of the source/drain electrodes of the first thin film transistor is connected to the gate electrode of the second thin film transistor, and data voltage is applied from the corresponding data line through the first thin film transistor to which the scanning signal is supplied.

3. The light-emitting display device according to claim 1, wherein the semiconductor layer includes: a first semiconductor layer provided on the gate insulating film; and a second semiconductor layer provided on the first semiconductor layer,
the first semiconductor layer is made of crystalline semiconductor, and
the second semiconductor layer is made of amorphous semiconductor.

4. The light-emitting display device according to claim 3, wherein the thickness of the source region and the drain region of the first semiconductor layer in the first thin film transistor is identical to the thickness of the source region and the drain region of the first semiconductor layer in the second thin film transistor, and
the thickness of the source region and the drain region of the second semiconductor layer in the first thin film transistor is greater than the thickness of the source region and the drain region of the second semiconductor layer in the second thin film transistor.

5. The light-emitting display device according to claim 1, wherein a thickness of the channel region of the semiconductor layer in the second thin film transistor is identical to the thickness of the semiconductor layer in the first thin film transistor, the channel region being a region other than the source region and the drain region of the semiconductor layer in the second thin film transistor.

6. The light-emitting display device according to claim 1, wherein, in the semiconductor layer in the second thin film transistor, the thickness of the channel region which is other than the source region and the drain region is greater than the thickness of the source region and the drain region.

7. The light-emitting display device according to claim 6, wherein the semiconductor layer in the second thin film transistor is formed such that the thickness of the source region and the drain region and the thickness of the channel region change discontinuously.

8. The light-emitting display device according to claim 1, wherein a thickness of the source region and the drain region of the semiconductor layer in the second thin film transistor is adjusted at the time of forming, by etching using a multi-tone mask.

9. The light-emitting display device according to claim 1, wherein the light-emitting element is an organic electroluminescent element.

10. A manufacturing method for a light-emitting display device including: an array of a plurality of light-emitting pixels; a plurality of data lines; and a power line for supplying current to the light-emitting pixels, which are arranged on a substrate, and each of the light-emitting pixels including a first thin film transistor, a second thin film transistor, and a light-emitting element, said manufacturing method comprising:

forming, on the substrate, gate electrodes of the first and second thin film transistors;

forming, on the gate electrodes, gate insulating films of the first and second thin film transistors;

forming, on the gate insulating films, semiconductor layers of the first and second thin film transistors such that a thickness of a source region and a drain region of a semiconductor layer in the second thin film transistor is smaller than a thickness of a source region and a drain region of a semiconductor layer in the first thin film transistor;

forming, on the semiconductor layers, doped semiconductor layers of the first and second thin film transistors; and forming, on the doped semiconductor layers, source/drain electrodes of the first and second thin film transistors, the gate electrode of the second thin film transistor is configured such that data voltage is applied from a corresponding one of the data lines, and the light-emitting element is configured such that current according to the applied voltage is supplied from the power line through the second thin film transistor.

11. The manufacturing method for light-emitting display device according to claim 10, wherein the thickness of the semiconductor layer in the second thin film transistor is adjusted at the time of forming, by etching using a multi-tone mask.

* * * * *